United States Patent [19]

Lindberg et al.

[11] Patent Number: 5,229,306

[45] Date of Patent: Jul. 20, 1993

[54] BACKSIDE GETTERING METHOD EMPLOYING A MONOCRYSTALLINE GERMANIUM-SILICON LAYER

[75] Inventors: Keith J. Lindberg, Sherman; Greg Gopffarth, Bonham; Jerry D. Smith, Sherman, all of Tex.

[73] Assignee: Texas Instruments Incorporated, Dallas, Tex.

[21] Appl. No.: 457,441

[22] Filed: Dec. 27, 1989

[51] Int. Cl.$^5$ .................................. H01L 21/20
[52] U.S. Cl. ............................ 437/12; 437/126
[58] Field of Search ............... 437/12, 10, 126; 148/DIG. 59, DIG. 60

[56] References Cited

U.S. PATENT DOCUMENTS

| | | | |
|---|---|---|---|
| 3,997,368 | 12/1976 | Pétroff et al. | 148/DIG. 60 |
| 4,357,183 | 11/1982 | Fan et al. | 437/134 |
| 4,608,096 | 8/1986 | Hill | 437/12 |
| 4,962,051 | 10/1990 | Liaw | 437/26 |
| 4,975,387 | 12/1990 | Prokes et al. | 437/126 |

*Primary Examiner*—Olik Chaudhuri
*Assistant Examiner*—G. Fourson
*Attorney, Agent, or Firm*—Gary C. Honeycutt; Richard L. Donaldson; William E. Hiller

[57] ABSTRACT

A method for gettering metal atoms (28) from a subsequently contaminated silicon substrate (12) is disclosed. A smoothed or polished first surface (16) has a thin germanium silicon layer (20) deposited thereon. A silicon layer (24) is deposited onto the germanium silicon layer (20) to seal the layer (20) between the substrate (12) and the silicon layer (24). Electronic components (26) are fabricated on a second surface (14) of the silicon substrate (12) which causes the metal atoms (28) to contaminate the substrate as a result of contamination in normal processing (12). As the substrate (12) is heated during normal processing of the devices, metal atoms (28) in the substrate of a result of contamination, diffuse in the substrate (12) to the misfit dislocations at the germanium-silicon (20)/silicon interface.

7 Claims, 1 Drawing Sheet

BACKSIDE GETTERING METHOD EMPLOYING A MONOCRYSTALLINE GERMANIUM-SILICON LAYER

TECHNICAL FIELD OF THE INVENTION

This invention relates in general to gettering, and more particularly to gettering for isolating metal atoms in the silicon substrate away from the active devices on the silicon substrate.

BACKGROUND OF THE INVENTION

Several problems have heretofore been encountered when attempting to isolate metal atoms in a silicon substrate away from the active devices, commonly known as gettering. During manufacture of an integrated circuit, metal atoms often migrate into the silicon substrate when electronic components are assembled on the substrate. Unfortunately, during processing of the product, such metal atoms tend to migrate throughout the substrate. If a sufficient number of metal atoms migrate to the active device, the effectiveness of the integrated circuit can be significantly reduced. Problems caused by such metal atoms in the active device can range from electrical shorting of the integrated circuit to inadequate device performance due to reduced minority carrier lifetime.

In the past, gettering processes have been used in the integrated circuit industry to isolate or getter these metal atoms away from the active device by one of several methods. One such method is backside damaging of the silicon substrate. By damaging the surface, lattice dislocations form on the backside of the substrate. The metal atoms migrate to the lattice dislocations where they are trapped. Unfortunately, damaging of the backside is usually nonuniform, and tends to cause contamination of the substrate surface by permitting free silicon particles to accumulate at the surface of the substrate.

The depositing of a polysilicon layer onto the backside of the substrate is another method of gettering metal atoms. By forming a layer of polysilicon adjacent to the silicon surface, dislocations of the lattice structure form at the interface of the layers and capture metal molecules from the silicon substrate. Metal atoms will also be trapped at the polysilicon grain boundries. This deposition is costly and time consuming because it requires an additional processing step of depositing a polysilicon layer. Additionally, it has been found that the polysilicon layer is easily etched away which ultimately results in the removal of the gettering material.

A need has therefore arisen for an improved gettering process which eliminates detrimental effects of metal atoms which can migrate to the active device during manufacturing to form a final integrated circuit product. Additionally, there is a need for a gettering process which will not contaminate the surface of a silicon substrate, and which will be evenly deposited to insure efficient gettering of the metal atoms in the substrate. Finally, there is a need for a gettering technique which is easily manufactured and can provide payback.

SUMMARY OF THE INVENTION

One aspect of the present invention comprises a gettering mechanism for isolating metal atoms in the substrate away from the active devices of the integrated circuits. Initially, a germanium silicon layer, which functions as a sacrificial layer, is deposited on a silicon substrate such that a continuous layer is formed across the substrate. A first surface of the substrate can be polished such that it provides an even contact surface for the deposition of the germanium silicon layer. However, this is not required. Lattice structure misfit dislocations are created along the interface between the germanium silicon layer and the silicon substrate. After the misfit germanium silicon layer has been deposited on the silicon substrate, a silicon layer may optionally be deposited onto the germanium layer which seals the germanium layer between the substrate and the silicon layer. This sealing of the germanium silicon layer will provide an additional layer of misfit dislocations and serve as a sacrificial layer to ensure the gettering mechanism remains throughout the entire integrated circuit manufacture.

Once this composite layer has been formed, electronic components are fabricated on the substrate to form the integrated circuit. As the electronic components are fabricated on the substrate, metal atoms tend to migrate in the silicon substrate. The present invention comprises a method for generating misfit dislocations on the backside of the wafer by the deposition of a germanium silicon layer (typically, approximately 0.1% to 25% germanium in silicon and approximately 0.1 microns to 25 mm thick) on the backside of a silicon substrate. An optional silicon layer may be deposited onto the germanium/silicon layer, but is not required. Typical processing of devices on silicon wafer requires temperatures between approximately 300° C. and approximately 1400° C. At these temperatures the metal atoms are mobile in the silicon wafer and migrate to the misfit dislocations at the germanium silicon/silicon interface and are permanently trapped.

Once the germanium silicon layer has gettered the metal atoms, the germanium silicon layer and silicon layer are removed. Removal of the silicon layer and the germanium silicon layer is optional, but is generally dictated by packaging requirements for the particular application.

The present invention presents several technical advantages over the conventional method for gettering metal atoms from a silicon substrate. These advantages include the efficient reduction of metal clusters which form during processing and the reduction of particulate contamination on the surface of the silicon substrate. Additionally, the present invention provides the technical advantage of uniformly depositing a sacrificial layer to insure that there is adequate gettering of the entire substrate. Finally, the present invention can be more cost effective for the finished product and easier implemented than the prior art.

BRIEF DESCRIPTION OF THE DRAWINGS

Other aspects of the invention and their advantages will be discerned after studying the detailed description in conjunction with the Drawings.

DETAILED DESCRIPTION OF THE INVENTION

Figure 1:
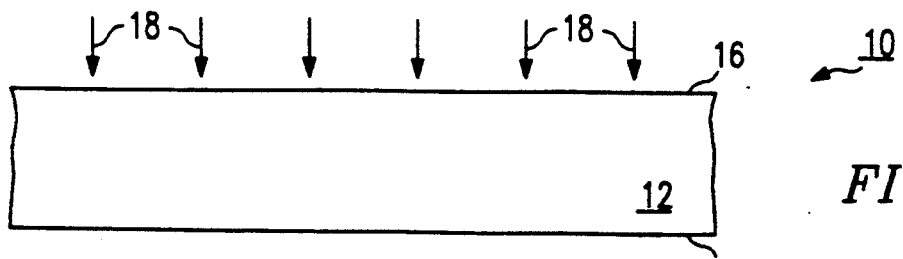
FIG. 1 is an enlarged cross-sectional view of a workpiece illustrating the implementation of a thin layer of silicon to a substrate.

Referring to FIG. 1, an integrated circuit workpiece is shown in an enlarged cross-sectional view and is generally designated 10. Workpiece 10 is preferably made of silicon and may have a thickness of approximately 550 microns. Workpiece 10 has a backside 14 and a front side 16. Front surface 16 is initially exposed to a lapping process which knocks off rough edges. Once the lapping process is completed, a polishing process prepares surface 16 for subsequent processing.

Figure 2:
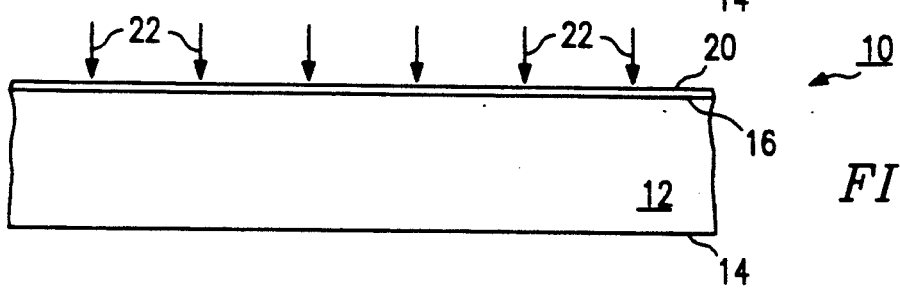
FIG. 2 is an enlarged cross-sectional view of the workpiece shown in FIG. 1, illustrating subsequent implementation of a germanium silicon layer onto the substrate.

Referring now to FIG. 2, workpiece 10 is exposed to a silicon (2% germanium) chemical vapor deposition 22 in order to evenly coat a layer 20 thereon. Layer 20 is a germanium silicon composition approximately 1 to 2 microns thick, which functions to generate misfit dislocations at the silicon/silicon germanium interface due to the difference in lattice parameters of silicon and silicon germanium. Layer 20 may vary in thickness between approximately 0.1 microns and approximately 25 microns. This layer 20 creates a lattice structure misfit dislocations between the interface of layers 12 and 20 at surface 16. These lattice structure dislocations are subsequently used for gettering metal atoms from substrate 12 in accordance with the present invention.

In an alternative embodiment, Si (2% Ge) can be replaced with a mixture of silicon and tin. It should be understood that germanium and tin atoms are used to cause lattice structure misfit dislocations at the interface and that other Group IV compounds may be used in place of germanium and tin if they cause the necessary lattice structure misfit dislocations.

Figure 3:
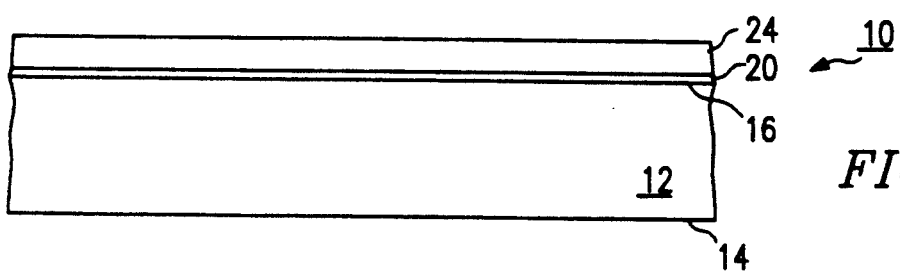
FIG. 3 is an enlarged a cross-sectional view of the workpiece shown in FIG. 2, illustrating a silicon layer which has been deposited onto the germanium silicon layer.

Referring now to FIG. 3, a sealing layer 24 is deposited onto germanium-silicon layer 20. Sealing layer 24 is preferably a silicon composition such as pure silicon which is deposited by a chemical vapor deposition process. Sealing layer 24 is used to insure that germanium atoms do not depart from layer 20 and contaminate substrate 12 during future processing. Layer 24 is preferably deposited at a thickness range of approximately 2 microns to approximately 5 microns. At this point, the workpiece 10 may be sent to the wafer fab for future processing or may be sent to the front end of the processing facility to fabricate devices thereto.

Figure 4:
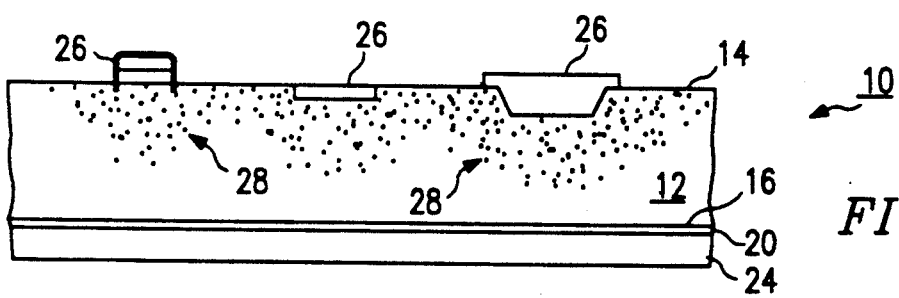
FIG. 4 is an enlarged cross-sectional view of the workpiece shown in FIG. 3 illustrating electronic components connected to the substrate.

Referring to FIG. 4, subsequent processing steps using the present invention can be appreciated. During processing, several electronic components 26 are fabricated on the front surface 14 by conventional techniques. When components 26 are fabricated on the surface 14, metal molecules 28 tend to migrate and dispense through the lattice structure of silicon substrate 12 at high temperature. When the metal atoms migrate into silicon layer 14, the metal atoms tend to form clusters during processing when the temperature is increased significantly. This clustering of metal atoms 28 can cause future processing difficulties, such as shorting of the integrated circuit, or contaminating of the surface. Single metal atoms located in the active device can also reduce minority carrier lifetime resulting in reduced device performance.

Figure 5:
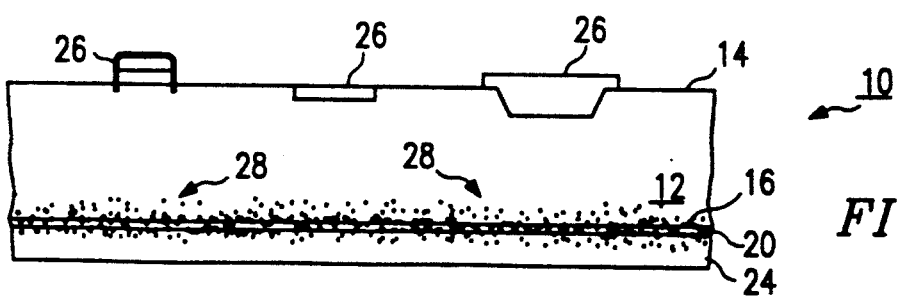
FIG. 5 is an enlarged cross-sectional view of the workpiece shown in FIG. 4, illustrating the metal molecules after gettering from the front surface of the substrate to the back surface of the substrate in accordance with the present invention.

Referring now to FIG. 5, the method of gettering metal atoms 28 from silicon substrate 12 can be appreciated. When substrate 12 is heated to a typical processing temperature between approximately 300° C. and approximately 1400° C., metal atoms randomly migrate through the silicon lattice. When a migrating metal atom encounters a misfit dislocation at the germanium silicon/silicon interface, it is permanently trapped. This trapping of metal atoms at the dislocations results in a concentration gradient of metal atoms in the substrate and a net flux or migration of metal atoms to the misfit dislocations at the interface layer 16 resulting from the germanium silicon/silicon interface.

In accordance with the present invention, sacrificial layer 20 is deposited to induce the formation of misfit dislocations at a specific selected location and to cause metal atoms 28 to migrate to that particular location when substrate 12 is heated. As can be seen in FIG. 5, migration of metal atoms 28 to sacrificial layer 20 tends to reduce the concentration of metal atoms reaching the front surface 14. This location of metal molecules 28 away from front surface 14 reduces the possibility of metal clustering within substrate 12 at front surface 14. This reduction in metal clustering reduces the possibility of shorting of the integrated circuit and contamination of the surface. This reduction in metal atoms near the front surface increases minority carrier lifetime resulting in improved device performance.

The present invention presents technical features over the prior art which has had difficulties with forming a uniform gettering efficiency on substrate 12. By having a nonuniform gettering efficiency, there is a possibility that a large concentration of metal molecules 28 will penetrate the substrate and diffuse to the surface which can cause operational problems.

Figure 6:
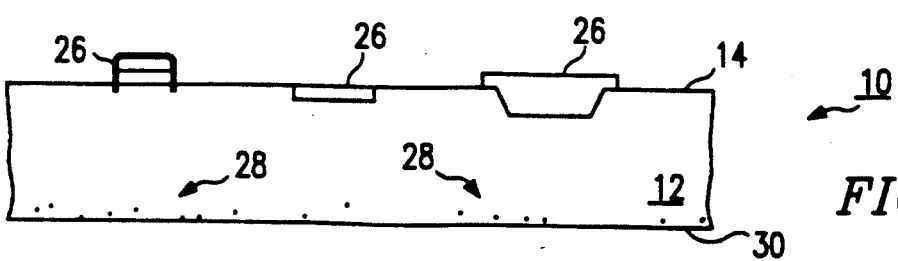
FIG. 6 is an enlarged cross-sectional view of the workpiece shown in FIG. 5, illustrating the workpiece after the germanium silicon layer and silicon layer have been removed from the substrate.

Referring now to FIG. 6, it can be seen that sacrificial layer 20 and sealing layer 24 have been removed. The removal of layers 20 and 24 is optional, but when performed allows for increased space within the packaging area. The reduced thickness of substrate 12 and removal of layers 20 and 24 do not take away from the functionality of workpiece 10. Once sacrificial layer 20 and sealing layer 24 have been removed from workpiece 10, metal molecules 28 are also removed from workpiece 10, thus eliminating any possibility of future clustering of the metal molecules in the event of a high temperature excursion.

The present invention and its advantages can be readily understood by reviewing the example illustrated below:

EXAMPLE

A gettering apparatus was initially prepared by lapping and polishing the backside surface of a silicon wafer. After the surface was uniformly smoothened, the backside surface was exposed to a source of pure silicon atoms to prepare the backside surface for receiving a germanium source. A silicon (2% germanium) vapor was cycled through a reaction chamber which had a volume of approximately 200 liters. The reactor, was an Applied Material Technology model "AMT-7810".

The reactor was supplied with a premix chamber for completely mixing a hydrogen source and Si (2% Ge) source.

The rates of the gases to the chamber were approximately 200 liters per minute hydrogen and approximately 0.8 liters per minute silicon with germanium 2% of silicon flow (2% Ge), respectively. The temperature of the chamber was approximately 1000° C., and the pressure of the chamber was approximately 1 atmosphere. The resulting thickness of the germanium silicon layer deposited on the silicon substrate was approximately 1.5 microns. A layer of silicon was evenly deposited on the germanium silicon layer to approximately 4 microns.

Metal impurities were purposely smeared onto the backside surface of the silicon substrate. The substrate, having the metal impurities on the backside thereto, was held in a furnace for approximately twenty (20) seconds at a temperature of approximately 1000° C. Upon inspection of the front side of the silicon wafer, no haze was observed. This absence of haze indicated that metal molecules migrated to the germanium silicon surface, and that minimal contamination reached the front surface existed after heating of the silicon substrate.

In summary, an advantageous gettering process has been disclosed which features the use of a germanium silicon layer utilized as a sacrificial layer embedded between two layers of silicon. The gettering process of the invention confers significant advantageous in terms of uniformity, reduction of metal clusters, reduction of contaminants on the surfaces, and more uniform gettering.

While preferred embodiments of the invention and their advantages have been disclosed in the above detailed description, the invention is not limited thereto, but only by the spirit and scope of the appended claims.

What is claimed is:

1. A method of gettering, which comprises the steps of:
   depositing a sacrificial monocrystalline germanium-silicon layer onto a monocrystalline silicon substrate to create misfit dislocations at the interface;
   fabricating a device on the opposite surface of said substrate such that metal atoms from said fabricating of the device migrate into said substrate; and
   heating said substrate to induce the migration of metal atoms from said substrate to the misfit dislocations at the germanium-silicon, silicon interface.

2. The method as recited in claim 1, further comprises the step of depositing a sealing layer on said germanium/silicon layer to confine said germanium/silicon layer between said substrate and said sealing layer.

3. The method as recited in claim 2, further comprising a step of removing said germanium-silicon layer and said sealing layer from said substrate after said metal molecules migrate to said misfit dislocations at the germanium silicon/silicon interface.

4. The method as recited in claim 1, wherein said step of heating said substrate increases the temperature of said substrate to between approximately 300° C. and approximately 1400° C.

5. A method for gettering metal atoms fromm a contaminated monocrystalline silicon substrate, which comprises the steps of:
   depositing a monocrystalline germanium-silicon layer on a first surface of the substrate to create misfit dislocations at the interface;
   depositing a silicon layer on said germanium-silicon layer to seal said germanium-silicon layer between said silicon layer and the substrate;
   fabricating devices on the opposite surface of the substrate such that metal atoms contaminate the substrate which originates from contamination during normal processing; and
   heating the substrate to induce the migration of metal molecules from the substrate to the vicinity of said germanium-silicon layer such that the substrate is substantially metal molecule-free.

6. The method as recited in claim 5, further comprising the step of removing said germanium-silicon layer and said silicon layer from the substrate.

7. The method as recited in claim 5, wherein said step of heating the substrate increases the temperature to between 300° C. and approximately 1400° C.

* * * * *